(12) United States Patent
Guo et al.

(10) Patent No.: US 12,046,581 B2
(45) Date of Patent: Jul. 23, 2024

(54) INTEGRATED CIRCUIT PACKAGE WITH GLASS SPACER

(71) Applicant: Intel Corporation, Santa Clara, CA (US)

(72) Inventors: Mao Guo, Shanghai (CN); Hyoung Il Kim, Folsom, CA (US); Yong She, Songjiang (CN); Sireesha Gogineni, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 17/723,166

(22) Filed: Apr. 18, 2022

(65) Prior Publication Data

US 2022/0254757 A1 Aug. 11, 2022

Related U.S. Application Data

(62) Division of application No. 16/326,650, filed as application No. PCT/CN2016/099714 on Sep. 22, 2016, now Pat. No. 11,393,788.

(51) Int. Cl.
*H01L 25/065* (2023.01)
*H01L 25/00* (2006.01)
*H01L 25/18* (2023.01)

(52) U.S. Cl.
CPC .......... *H01L 25/0657* (2013.01); *H01L 25/18* (2013.01); *H01L 25/50* (2013.01); *H01L 2225/0651* (2013.01); *H01L 2225/06575* (2013.01); *H01L 2225/06586* (2013.01)

(58) Field of Classification Search
CPC ................. H01L 25/0657; H01L 25/18; H01L 2225/06586
See application file for complete search history.

(56) References Cited

U.S. PATENT DOCUMENTS

| 7,901,987 B2 | 3/2011 | Yang et al. |
| 7,998,791 B2 | 8/2011 | Chong et al. |
| 2005/0023654 A1 | 2/2005 | Seng Kim et al. |
| 2008/0054433 A1* | 3/2008 | Yoo .......................... H01L 25/18 |
| | | 257/E23.18 |
| 2009/0236718 A1* | 9/2009 | Yang ..................... H01L 25/105 |
| | | 257/E23.116 |

(Continued)

OTHER PUBLICATIONS

International Search Report and Written Opinion dated Jul. 20, 2017 for International Patent Application No. PCT/CN2016/099714, 11 pages.

(Continued)

*Primary Examiner* — Dale E Page
*Assistant Examiner* — Wilner Jean Baptiste
(74) *Attorney, Agent, or Firm* — Schwabe, Williamson & Wyatt, P.C.

(57) ABSTRACT

Apparatuses, systems and methods associated with integrated circuit (IC) package design are disclosed herein. In embodiments, an IC package may include a first die and a second die. The IC package may include a spacer located between the first die and the second die, the spacer includes glass, and a molding compound that at least partially encompasses the first die, the second die, and the spacer. Other embodiments may be described and/or claimed.

20 Claims, 6 Drawing Sheets

(56) References Cited

U.S. PATENT DOCUMENTS

| | | | |
|---|---|---|---|
| 2013/0026623 A1* | 1/2013 | Chen | H01L 23/16 257/737 |
| 2013/0059435 A1* | 3/2013 | Yang | H01L 29/66545 257/E21.409 |
| 2015/0179555 A1 | 6/2015 | Kim et al. | |
| 2016/0113115 A1 | 4/2016 | Kwon et al. | |
| 2016/0329298 A1 | 11/2016 | Lee et al. | |

OTHER PUBLICATIONS

Non-Final Office Action issued Nov. 5, 2021 for U.S. Appl. No. 16/326,650, 11 pages.

Notice of Allowance issued Mar. 18, 2022 for U.S. Appl. No. 16/326,650, 9 pages.

\* cited by examiner

INTEGRATED CIRCUIT PACKAGE WITH GLASS SPACER

CROSS REFERENCE TO RELATED APPLICATION

The present application is a divisional of U.S. application Ser. No. 16/326,650, filed Feb. 19, 2019, entitled "INTEGRATED CIRCUIT PACKAGE WITH GLASS SPACER," which is a national phase entry under 35 U.S.C. § 371 of International Application No. PCT/CN2016/099714, filed Sep. 22, 2016, entitled "INTEGRATED CIRCUIT PACKAGE WITH GLASS SPACER." PCT/CN2016/099714 designated, among the various States, the United States of America. The Specification of the PCT/CN2016/099714 Application is hereby incorporated by reference.

TECHNICAL FIELD

The present disclosure relates to the field of electronic circuits. More particularly, the present disclosure relates to integrated circuit package design.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In some legacy system-in-package (SIP) integrated circuit (IC) package designs, the SIP IC package may include an application-specific IC (ASIC) die located toward a first side of the SIP IC package that may be mounted to a printed circuit board. The ASIC die may be located toward the first side of the SIP IC package for, for example, signal integrity and power purposes. The SIP IC package may further include a dynamic random access memory (DRAM) die located between the ASIC die and a second side of the SIP IC package, the second side of the SIP IC package opposite to the first side of the SIP IC package, with a silicon spacer located between the DRAM die and the ASIC die.

The orientation of the legacy SIP IC package may present a heating issue due to the ASIC die, generally, having a higher operational temperature than the DRAM die. Heat produced by the ASIC die may transfer, via the SIP IC package material and the silicon spacer, to the DRAM die. The heat transfer may cause a junction temperature of the DRAM die to exceed a maximum operational junction temperature of the DRAM die, which would cause the SIP to turn off. As the silicon spacer has a relatively high thermal conductivity, the silicon spacer provided little protection from the DRAM die being heated and causing the SIP to turn off.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
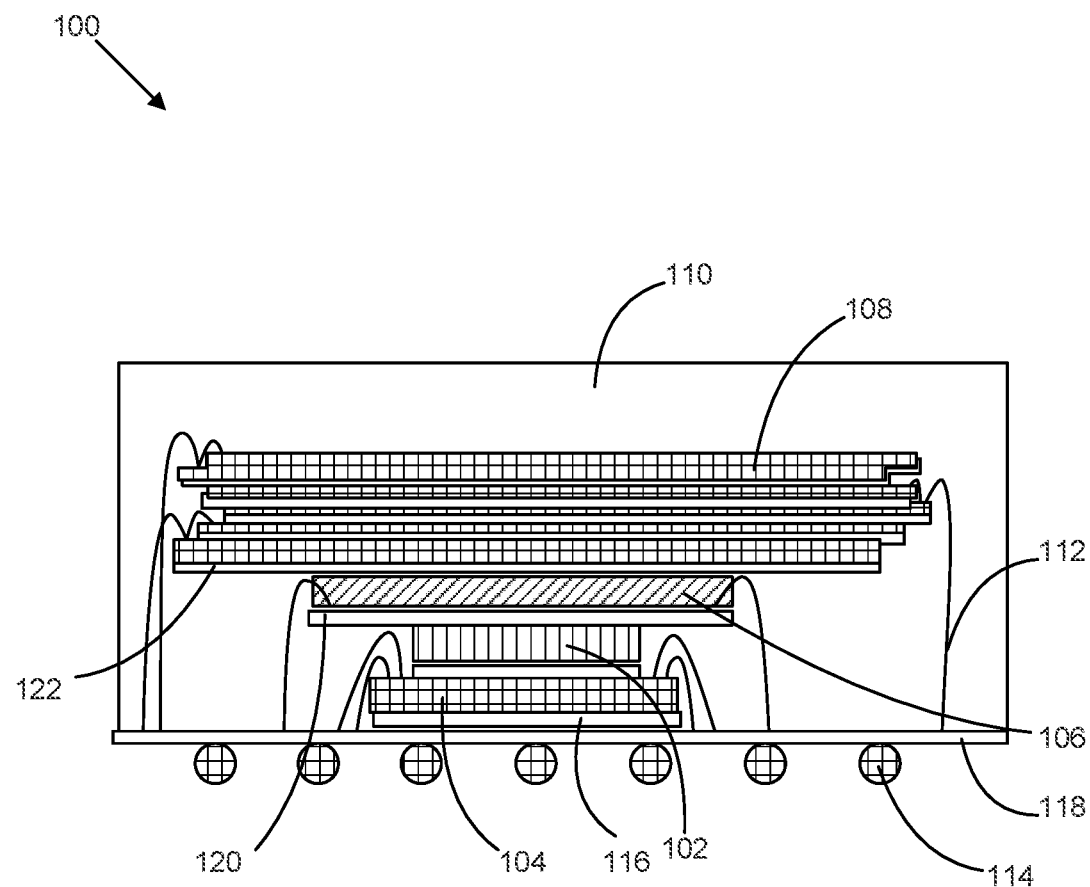
FIG. 1 illustrates an example integrated circuit package, according to various embodiments.

Apparatuses, systems and methods associated with integrated circuit (IC) package design are disclosed herein. In embodiments, an IC package may include a first die and a second die. The IC package may include a spacer located between the first die and the second die, the spacer includes glass, and a molding compound that at least partially encompasses the first die, the second die, and the spacer.

The spacer may include three layers. The glass included in the spacer may be located within a core layer, which is located between two mask layers on opposing sides of the core layer. The spacer may have a relatively low thermal conductivity, which may prevent and/or decrease an amount of heat transfer from the first die to the second die via the spacer. Other embodiments may be described and/or claimed.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example integrated circuit (IC) package 100, according to various embodiments. In some embodiments, the IC package 100 may be a system-in-package. The IC package 100 may include one or more dies, such as memory dies, dynamic random-access memory (DRAM) dies, controller dies (such as ASIC dies), passive dies, and/or some combination thereof. The dies may be in a stacked configuration with a first die located toward a first side of the IC package 100 to be mounted to a printed circuit board (PCB), a second die located between the first die and a second side of the IC package 100, the second side opposite to the first side, a third die located between the second die and the second side of the IC package 100, and so forth.

The IC package 100 may include a first die 104. The first die 104 may be located toward the first side of the IC package 100 to be mounted to the PCB and may extend parallel to the side of the IC package 100. The first die 104 may include an IC to perform one or more particular operations. In some embodiments, the first die 104 may be, for example, an ASIC die to perform one or more operations associated with an application of the IC package 100.

The IC package 100 may further include a second die 106. The second die 106 may be stacked above the first die 104, located between the first die 104 and the second side of the IC package 100, the second side opposite to the first side of the IC package 100. The second die 106 may be, for example, a DRAM die for storage of data.

The IC package 100 may further include a die group 108. The die group 108 may include one or more dies that perform the same or similar operations as the other dies within the die group 108. The die group 108 may be stacked above the second die 106, between the second die 106 and the second side of the IC package 100. Each die in the die group 108 may further be stacked in relation to other dies within the die group 108. In some embodiments, the die group 108 may include, for example, one or more NAND flash memory dies.

While the IC package 100 is described with the first die 104, the second die 106, and the die group 108, it is to be understood that the IC package 100 may include more or less dies and/or die groups in other embodiments. Further, while the first die 104, the second die 106, and the die group 108 are described as being stacked from the first side of the IC package 100, that may be mounted to the PCB, toward the second side of the IC package 100, opposite to the first side, it is to be understood that the dies and/or die groups may be stacked in different directions in other embodiments.

In some embodiments, die attach film (DAF) may be applied to one or more sides of the first die 104, the second die 106, and/or one or more dies of the die group 108, such as first DAF 116 applied to first die 104, second DAF 120 applied to second die 106, and DAFs 122 applied to the dies of the die group 108 (collectively, "the DAFs"). The DAFs may include die-attach films laminated directly to the dies. In some embodiments, the DAFs may include epoxy die attach, die attach paste, die attach tape, and/or some combination thereof. The DAFs may provide thermal resistance, however, an amount of thermal resistance provided by the DAFs may be limited by a thickness of the DAFs, which may range between approximately 10 micrometers and approximately 20 micrometers thick.

The IC package 100 may include a distribution layer 118. The distribution layer 118 may include one or more traces to route electrical signals. Traces of the distribution layer 118 may be coupled to one or more contacts 114 and may route the electrical signals to and/or from the one or more of the contacts 114. In the embodiment illustrated, the one or more contacts 114 include a ball grid array, however, it is to be understood that in other embodiments the one or more contacts may include a pin grid array, a land grid array, one or more solder balls, one or more wire leads, surface mount contacts, through-hole contacts, or some combination thereof.

The IC package 100 may further include one or more wires 112. The wires 112 may couple one or more of the first die 104, the second die 106, the die group 108, or some combination thereof, to each other. Further, the wires 112 may couple one or more of the first die 104, the second die 106, the die group 108, or some combination thereof, to the distribution layer 118. Accordingly, the first die 104, the second die 106, the die group 108, or some combination thereof, may be coupled to each other and/or the one or more contacts 114 via the wires 112 and/or the distribution layer 118.

The IC package 100 may include a glass spacer 102. The glass spacer 102 may be included in the stacked configuration with one or more of the first die 104, the second die 106, and/or the die group 108, and may be located between the first die 104 and the second die 106. In some embodiments, the glass spacer 102 may be in contact with one or both of the first die 104 and the second die 106.

The glass spacer 102 may include three layers (such as the example glass spacer 200 of FIG. 2), with a core layer located between a first mask layer and a second mask layer. The core layer of the glass spacer 102 may include a glass fiber. The core layer of the glass spacer 102 may further include epoxy resin and silica filler. In some embodiments, the glass fiber may be impregnated with the epoxy resin and the silica filler to produce the core layer.

The first mask layer and the second mask layer of the glass spacer 102 may have a same chemical makeup. The first mask layer and the second mask layer may be a film-type material and may be applied to the core layer through a lamination process. In some embodiments, the first mask layer and the second mask layer may be film-type solder masks. In some embodiments, the first mask layer and the second mask layer of the glass spacer 102 may have different chemical makeups.

The first mask layer may be laminated to a first side of the core layer and the second mask layer may be laminated to a second side of the core layer, the second side opposite to the first side. The lamination process may include applying heat, light, chemicals, pressure, or some combination thereof, to the first mask layer, the second mask layer, and/or the core layer. The first mask layer and the second mask layer may be a solder mask and may be composed of epoxy resin and/or poly-acrylate. In some embodiments, the first mask layer and the second mask layer may further include one or more filler materials, such as silica filler. In some embodiments, the first mask layer and the second mask layer may include polymers and/or polyimide.

The glass spacer 102 may be produced to have a same or similar thickness as the silicon spacer of the legacy SIP IC packages with the ASIC die and the DRAM die described above. The glass spacer 102 may have a thickness between approximately 85 micrometers and approximately 115 micrometers. In some embodiments, the thickness of the glass spacer 102 may be approximately 100 micrometers. The first mask layer and the second mask layer of the glass spacer 102 may have a thickness between approximately 25 micrometers and approximately 35 micrometers. In some embodiments, the thickness of the first mask layer and the second mask layer may be approximately 30 micrometers. The core layer of the glass spacer 102 may have a thickness between approximately 35 micrometers and approximately 45 micrometers. In some embodiments, the thickness of the core layer may be approximately 40 micrometers.

In some other embodiments, the glass spacer 102 may include a single layer. The glass spacer 102 with the single layer may be composed of silicate glass. The glass spacer 102 with the single layer may also be produced to have a same or similar thickness as the silicon spacer of the legacy SIP IC packages with the ASIC die and the DRAM die. Accordingly, the glass spacer 102 may have a thickness between approximately 85 micrometers and approximately 115 micrometers. In some embodiments, the thickness of the glass spacer 102 may be approximately 100 micrometers. In some embodiments, the single layer may be composed of borosilicate, soda lime, quartz, or some combination thereof.

The glass spacer 102 may have a relatively low thermal conductivity, including in comparison to the silicon spacer of the legacy SIP IC packages with the ASIC die and the DRAM die. In particular, the glass spacer 102 may have a thermal conductivity of between approximately 0.2 and approximately 1.4 watts per meter kelvin, while the silicon spacer of the legacy SIP IC packages may have a thermal conductivity of approximately 147 watts per meter kelvin. Based on the relatively low thermal conductivity, the glass spacer 102 may reduce heat transfer between the first die 104 and the second die 106.

In some embodiments, the first die 104 may have a greater operational threshold value for temperature than the second die 106, or vice versa. The operational threshold value may be a temperature where an operation of a die may undesirably degrade when the temperature of the die exceeds the operational threshold value. The operational threshold value for the first die 104 and/or the second die 106 may be based on a period of a refresh cycle for volatile stored data versus a period of retention of the data before loss of the data for the first die 104 and/or the second die 106, breakdown of materials within the first die 104 and/or the second die 106, or some combination thereof. As temperatures of the first die 104 and/or the second die 106 increase, the period of retention of the data before loss may be decreased based on an increased rate of electrical discharge of storage capacitors (or other storage component) within the first die 104 and/or the second die 106 due to the temperature increase, and/or the materials may exhibit physical structure changes and/or chemical changes that cause decreased performance of the first die 104 and/or the second die 106.

In these embodiments, a reduced amount of heat transfer between the first die 104 and the second die 106 may be desired to prevent the first die 104, with the greater operational threshold value, from heating the second die 106, with the lower operational threshold value, to a temperature greater than the operational threshold value of the second die 106. Accordingly, positioning the glass spacer 102, which has a relatively low thermal conductivity, between the first die 104 and the second die 106 may limit an amount of heat transfer between the first die 104 and the second die 106 as may be desired.

In embodiments where the first die 104 is an ASIC die and the second die 106 is a DRAM die, the first die 104 may have an operational threshold value of between approximately 100 and approximately 125 degrees-Celsius, whereas the second die 106 may have an operational threshold value of between approximately 70 and approximately 90 degrees-Celsius. When within normal operation conditions, the first die 104 may operate at a temperature greater than approximately 70 degree-Celsius. Accordingly, it may be beneficial to decrease an amount of heat transfer from the first die 104 to the second die 106 to decrease chances that the second die 106 will exceed its operational threshold value due to heat produced by the first die 104. Positioning the glass spacer 102 between the first die 104 and the second die 106 may provide this benefit.

The IC package 100 may further include a molding compound 110. The molding compound 110 may at least partially encompass the first die 104, the second die 106, the die group 108, the glass spacer 102, or some combination thereof, on one or more sides. For example, at least partially encompass may mean that the molding compound 110 may surround the first die 104, the second die 106, the die group 108, and/or the glass spacer 102: on the top and sides, but not on the bottom; on the bottom and sides, but not the top; on the top and the bottom, but not on all the sides; or some combination thereof. In some embodiments, the molding compound 110 may encompass the first die 104, the second die 106, the die group 108, the glass spacer 102, or some combination thereof, on all sides. The molding compound 110 may be abutted on one side by the distribution layer 118. The molding compound 110 may be rigid and may protect the first die 104, the second die 106, the die group 108, the glass spacer 102, or some combination thereof, from damage. Further, the molding compound 110 may be an electrical insulator, preventing unintended electrical current transfer, via the molding compound 110, among the first die 104, the second die 106, the die group 108, the distribution layer 118, or some combination thereof.

The IC package 100 may be mounted to a PCB on a side of the IC package 100 on which the one or more contacts 114 are located. The one or more contacts 114 may mount and couple the IC package 100 to the PCB. When the IC package 100 is mounted to the PCB, heat from the first die 104 may be dissipated to the PCB, away from the second die 106.

Figure 2:
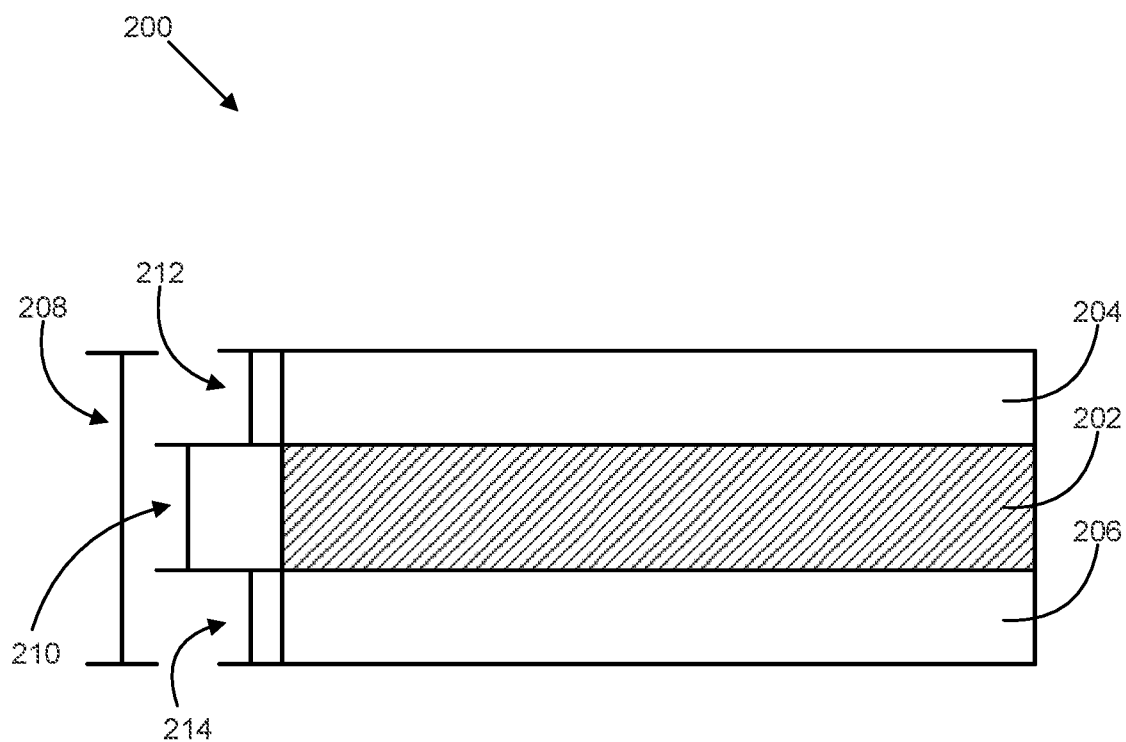
FIG. 2 illustrates an example layered glass spacer, according to various embodiments.

FIG. 2 illustrates an example layered glass spacer 200, according to various embodiments. The layered glass spacer 200 may be an example of the glass spacer 100 with the three layers described in relation to FIG. 1.

The layered glass spacer 200 may include three layers: a core layer 202, a first mask layer 204, and a second mask layer 206. The core layer 202 may be located between the first mask layer 204 and the second mask layer 206, with the first mask layer 204 abutting a first side of the core layer 202 and the second mask layer 206 abutting a second side of the core layer 202, the second side opposite to the first side.

The core layer 202 may include a glass fiber. The core layer 202 may further include epoxy resin and/or silica filler. In some embodiments, the glass fiber may be impregnated with the epoxy resin and the silica filler to produce the core layer. The core layer 202 may have a thermal conductivity of between approximately 0.25 and approximately 1 watt per meter kelvin. In some embodiments, the core layer may include borosilicate, soda lime, quartz, or some combination thereof.

The first mask layer 204 and the second mask layer 206 may have a same chemical makeup. The first mask layer 204 and the second mask layer 206 may be a film-type material and may be applied to the core layer 202 through a lamination process. The first mask layer 204 may be laminated to a first side of the core layer 202 and the second mask layer 206 may be laminated to a second side of the core layer 202, the second side opposite to the first side.

The first mask layer 204 and the second mask layer 206 may be a solder mask and may be composed of epoxy resin and poly-acrylate. In some embodiments, the first mask layer and the second mask layer may further include one or more filler material, such as silica filler. The first mask layer 204 and the second mask layer 206 may each have a thermal conductivity of between approximately 0.15 and approximately 0.4 watts per meter kelvin.

A thickness 208 of the layered glass spacer 200 may be a same or similar thickness as the silicon spacer of the legacy SIP IC packages with the ASIC die and the DRAM die. The thickness 208 may be between approximately 85 micrometers and approximately 115 micrometers. In some embodiments, the thickness 208 may be approximately 100 micrometers.

A thickness 212 of the first mask layer 204 may be between approximately 25 micrometers and approximately 35 micrometers. In some embodiments, the thickness 212 may be approximately 30 micrometers. A thickness 214 of the second mask layer 206 may be between approximately 25 micrometers and approximately 35 micrometers. In some embodiments, the thickness 214 may be approximately 30 micrometers. In some embodiments, the thickness 212 of the first mask layer 204 may be equal to the thickness 214 of the second mask layer 206.

A thickness 210 of the core layer 202 may be between approximately 35 micrometers and approximately 45 micrometers. In some embodiments, the thickness 210 of the core layer 202 may be approximately 40 micrometers.

The layered glass spacer 200 may have a relatively low thermal conductivity, including in comparison to the silicon spacer of the legacy SIP IC packages with the ASIC die and the DRAM die. In particular, the glass spacer 200 may have a thermal conductivity of between approximately 0.2 and approximately 1.4 watts per meter kelvin, while the silicon spacer of the legacy SIP IC packages may have a thermal conductivity of approximately 147 watts per meter kelvin. Accordingly, the layered glass spacer 200 may conduct less heat than the silicon spacer of the legacy SIP IC packages.

Figure 3:
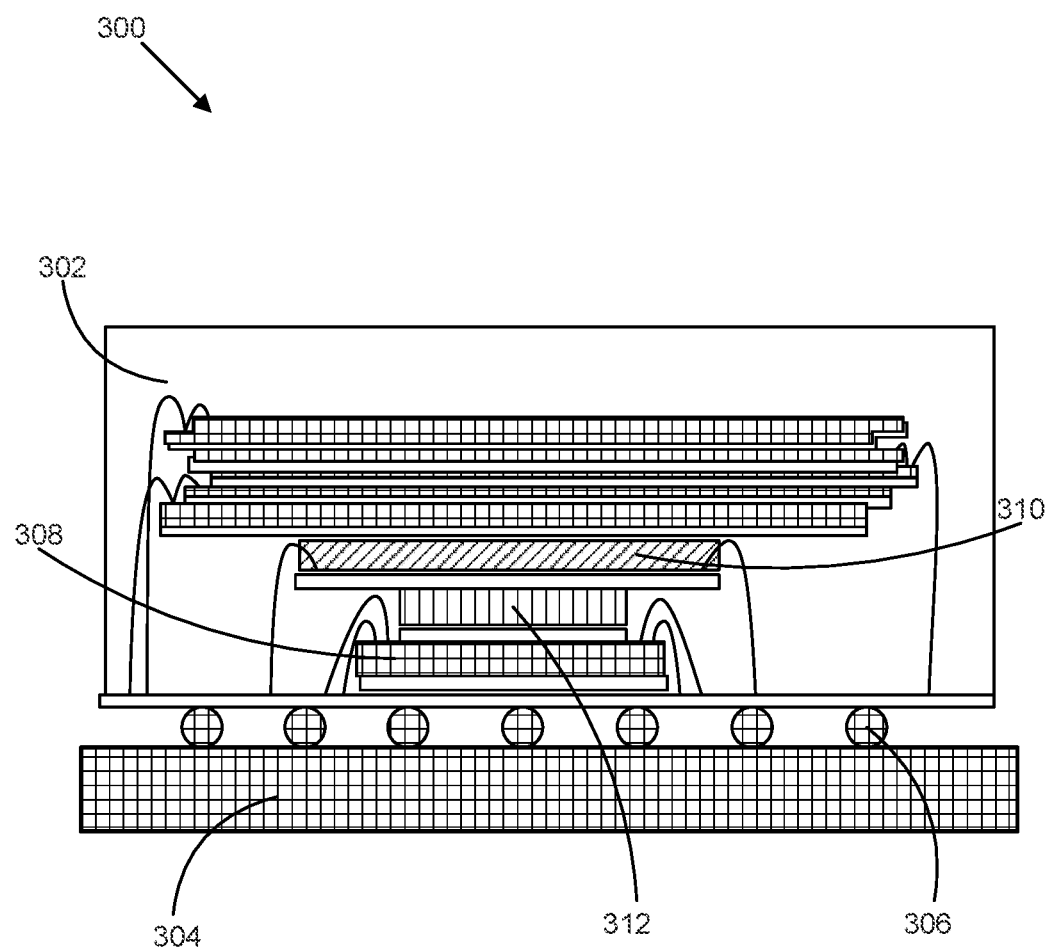
FIG. 3 illustrates an example computer system with an integrated circuit package, according to various embodiments.

FIG. 3 illustrates an example computer system 300 with an IC package 302, according to various embodiments. The IC package 302 may include one or more of the features of the IC package 100 (FIG. 1), including, but not limited to, the first die 104, the second die 106, and the glass spacer 102.

The IC package 302 may be mounted to a PCB 304. The IC package 302 may be mounted to the PCB 304 by one or more contacts 306. The one or more contacts 306 may include one or more features of the one or more contacts 114 (FIG. 1). The one or more contacts 306 may be coupled to traces on the PCB 304 and may electrically couple the IC package 302 to the PCB 304.

The IC package 302 may be mounted to the PCB 304 on a first side of the IC package 302. The IC package 302 may include a first die. The first die 308 may include one or more of the features of the first die 104 (FIG. 1). The first die 308 of the IC package 302 may be located toward the first side of the IC package 302, the first die 308 within the IC package 302. In some embodiments, the first die 308 may be an ASIC die.

The IC package 302 may include a second die 310. The second die 310 may include one or more of the features of the second die 106 (FIG. 1). The second die 310 may be located between a second side of the IC package 302 and the first die 308, the second side of the IC package 302 opposite to the first side of the IC package 302. In some embodiments, the second die 310 may be a DRAM die.

The IC package 302 may include a glass spacer 312. The glass spacer 312 may include one or more of the features of the glass spacer 102 (FIG. 1) and/or the layered glass spacer 200 (FIG. 2), including, but not limited to, the chemical makeup, the layers, and the thicknesses of the glass spacer 102 and/or the layered glass spacer 200. The glass spacer 312 may be located between the first die 308 and the second die 310.

Due to the IC package 302 being mounted to the PCB 304, heat produced by the IC package 302, and/or one or more of the components/dies within the IC package 302, may be transferred to the PCB 304. For example, heat produced by the first die 308 may be transferred, via the one or more contacts 306 and/or one or more points of contact between the IC package 302 and the PCB 304, to the PCB 304.

In some embodiments, the first die 308 may have a greater operational threshold value for temperature than the second die 310, or vice versa. The operational threshold value may be a temperature where an operation of a die may undesirably degrade when the temperature of the die exceeds the operational threshold value. The operational threshold value for the first die 308 and/or the second die 310 may be based on a period of a refresh cycle for volatile stored data versus a period of retention of the data before loss of the data for the first die 308 and/or the second die 310, breakdown of materials within the first die 308 and/or the second die 310, or some combination thereof. As temperatures of the first die 104 and/or the second die 106 increase, the period of retention of the data before loss may be decreased based on an increased rate of electrical discharge of storage capacitors (or other storage component) within the first die 308 and/or the second die 310 due to the temperature increase, and/or the materials may exhibit physical structure changes and/or chemical changes that cause decreased performance of the first die 308 and/or the second die 310.

In these embodiments, a reduced amount of heat transfer between the first die 308 and the second die 310 may be desired to prevent the first die 308, with the greater operational threshold value, from heating the second die 310, with the lower operational threshold value, to a temperature greater than the operational threshold value of the second die 310. Accordingly, situating the glass spacer 312, which has a relatively low thermal conductivity, between the first die 308 and the second die 310 may limit an amount of heat transfer between the first die 308 and the second die 310 as may be desired.

In some embodiments, a thermal conductivity of the glass spacer 312 may be less than the thermal conductivity of rest of the IC package 302. In these embodiments, since the glass spacer 312 has a thermal conductivity less than the rest of the IC package 302, heat produced by the first die 308 may be more likely to pass to the PCB 304, via a path of lower conductive resistance than the conductive resistance of the glass spacer 312, than to pass to the second die 310 via the glass spacer 312. Accordingly, due to the low thermal conductivity of the glass spacer 312, an amount of heat that passes from the first die 308 to the second die 310 may be less in embodiments with the glass spacer 312 than legacy SIP IC packages with a silicon spacer and similar configurations.

In embodiments where the first die 308 is an ASIC die and the second die 310 is a DRAM die, the first die 308 may have an operational threshold value of between approximately 100 and approximately 125 degrees-Celsius, whereas the second die 310 may have an operational threshold value of between approximately 70 and approximately 90 degrees-Celsius. When within normal operation conditions, the first die 308 may operate at a temperature greater than approximately 70 degree-Celsius. Accordingly, it may be beneficial reduce an amount of heat transfer from the first die 308 to the second die 310 to decrease chances that the second die 310 will exceed its operational threshold value due to heat produced by the first die 308. Positioning the glass spacer 312 between the first die 308 and the second die 310 may provide this benefit.

Figure 4:
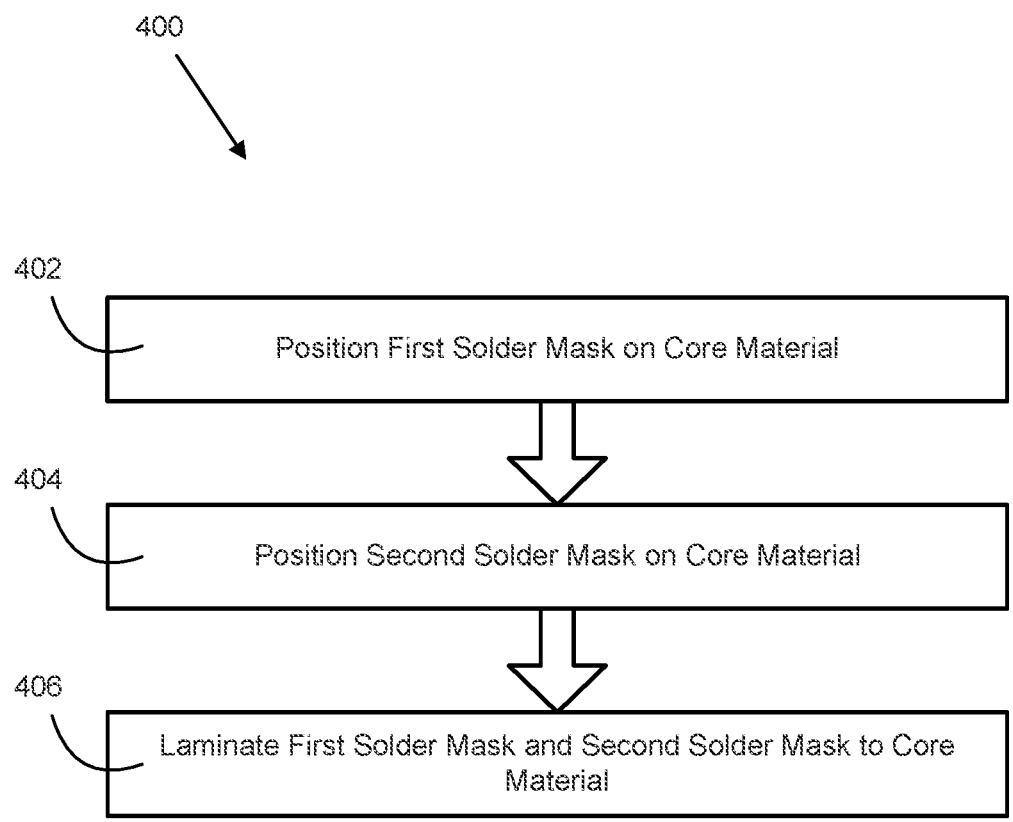
FIG. 4 illustrates an example process for producing a layered glass spacer, according to various embodiments.

FIG. 4 illustrates an example process 400 for producing a layered glass spacer, such as the layered glass spacer 200 (FIG. 2), according to various embodiments. In 402, a first mask layer may be positioned on a first side of a core layer. The first mask layer may include one or more of the features of the first mask layer described in relation to the glass spacer 102 (FIG. 1) and/or the first mask layer 204 (FIG. 2). The core layer may include one or more of the features of the core layer described in relation to the glass spacer 102 (FIG. 1) and/or the core layer 202 (FIG. 2).

Positioning the first mask layer on the first side of the core layer may include aligning, on the first side of the core layer, a width of the first mask layer with a width of the core layer. A side of the first mask layer may abut and/or contact the first side of the core layer when positioned on the first side of the core layer.

In 404, a second mask layer may be positioned on a second side of the core layer. The second side of the core layer may be opposite to the first side of the core layer. The second mask layer may include one or more of the features of the second mask layer described in relation to the glass spacer 102 (FIG. 1) and/or the second mask layer 206 (FIG. 2).

Positioning the second mask layer on the second side of the core layer may include aligning, on the second side of the core layer, a width of the second mask layer with a width of the core layer. A side of the second mask layer may abut and/or contact the second side of the core layer when positioned on the second side of the core layer. When both the first mask layer and the second mask layer are positioned, the core layer may be located between the first mask layer and the second mask layer.

In 406, the first mask layer and the second mask layer may be affixed to the core layer. The first mask layer and the second mask layer may be affixed to the core layer via a lamination process. The lamination process may include applying heat, light, chemicals, pressure, or some combination thereof, to the first mask layer, the second mask layer, and/or the core layer.

In some embodiments, the first mask layer and/or the second mask layer may include an adhesive and/or epoxy on the side of the first mask layer and/or the side of the second mask layer to be positioned on the core layer. The first mask layer and/or the second mask layer may become affixed to the core layer upon positioning of the first mask layer and/or the second mask layer on the core layer. Accordingly, the separate lamination process may not be performed in these embodiments.

Figure 5:
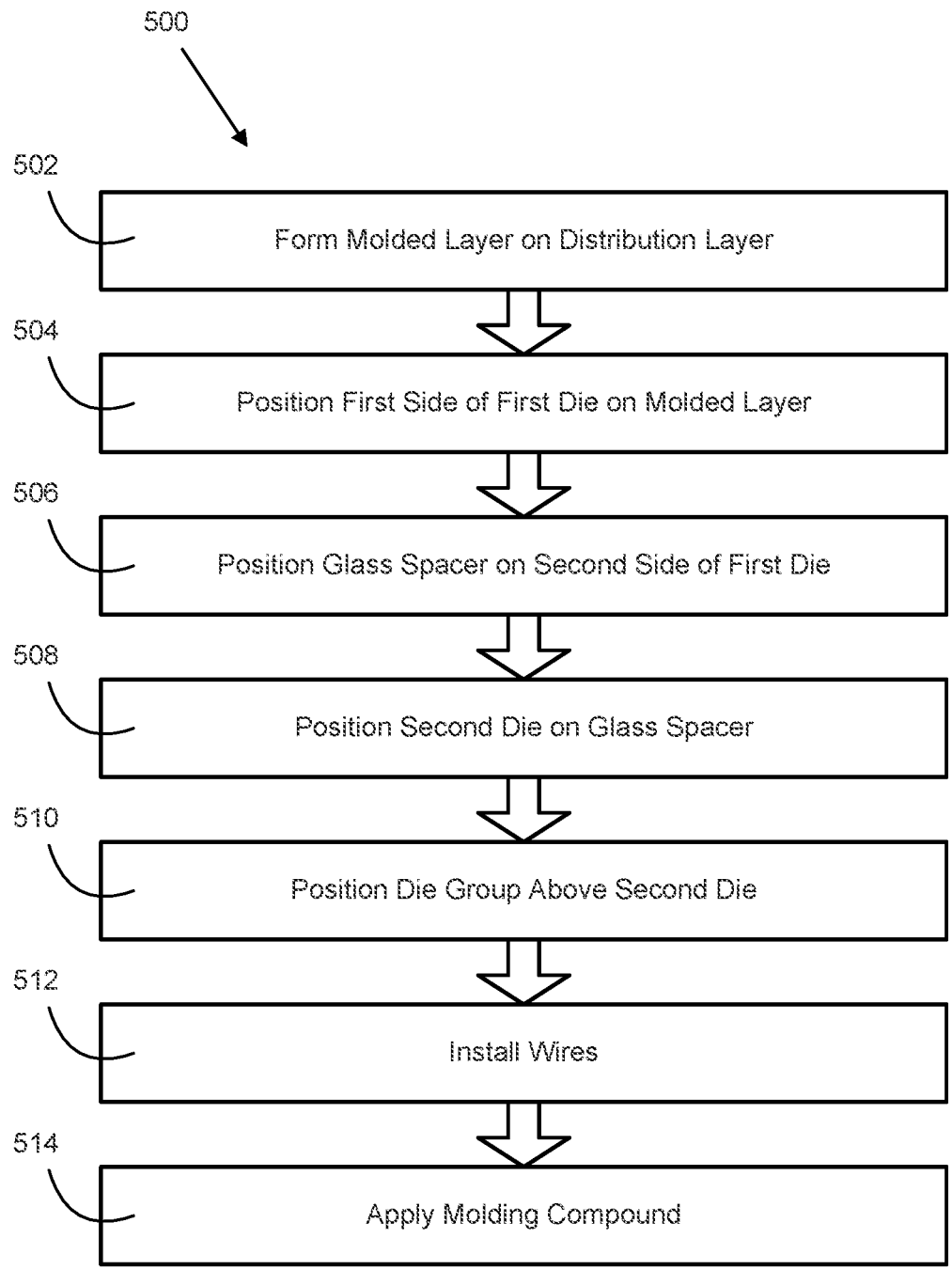
FIG. 5 illustrates an example process for producing an integrated circuit package, according to various embodiments.

FIG. 5 illustrates an example process 500 for producing an integrated circuit package, according to various embodiments. In 502, a molded layer may be formed on a distribution layer, such as the distribution layer 118 (FIG. 1). The molded layer may be formed on a first side of the distribution layer opposite to a second side of the distribution layer that has one or more contacts, such as the one or more contacts 114 (FIG. 1) and/or the one or more contacts 306 (FIG. 3). The molded layer may be a minimum thickness to prevent cross-talk between the distribution layer and one or more dies disposed on the molded layer, opposite to the distribution layer.

In 504, a first die, such as the first die 104 (FIG. 1) and/or the first die 308 (FIG. 3), may be positioned on the molded layer. A first side of the first die may abut the molded layer. The first die may be positioned toward a center of the molded layer.

In 506, a glass spacer, such as the glass spacer 102 (FIG. 1), the glass spacer 200 (FIG. 2), and/or the glass spacer 312 (FIG. 3), may be positioned on the first die. The glass spacer may be positioned on a second side of the first die, the second side opposite to the first side. The glass spacer may be positioned such that a center of the glass spacer is aligned with a center of the first die.

In 508, a second die, such as the second die 106 (FIG. 1) and/or the second die 310 (FIG. 3) may be positioned on the glass spacer. The second die may be positioned on a side of the glass spacer opposite from the first die. Accordingly, the glass spacer may be located between the first die and the second die. The second die may be positioned such that a center of the second die is aligned with the center of the glass spacer.

In 510, a die group, such as the die group 108 (FIG. 1), may be positioned on the second die. The die group may be positioned on a side of the second die opposite from the glass spacer. The die group may be positioned such that a center of the die group is aligned with the center of the second die.

In 512, one or more wires, such as the one or more wires 112 (FIG. 1), may be installed. The wires may be routed among the distribution layer, the first die, the second die, and/or the die group, and may electrically couple one or more of the components. In some embodiments, the wires may be coupled to the distribution layer prior to forming of the molded layer and may be coupled to one or more of the first die, the second die, and/or the die group after the forming of the molded layer.

In 514, a molding compound, such as the molding compound 110 (FIG. 1) is applied. The molding compound may abut the distribution layer and may at least partially encompass one or more of the first die, the glass spacer, the second die, the die group, the wires, or some combination thereof, on one or more sides. In some embodiments, the molding compound may abut the distribution layer and encompass one or more of the first die, the glass spacer, the second die, the die group, the wires, or some combination thereof on all sides. Application of the molding compound may include forming the molding compound and curing the molding compound through application of light, heat, chemicals, pressure, or some combination thereof, to the molding compound.

Figure 6:
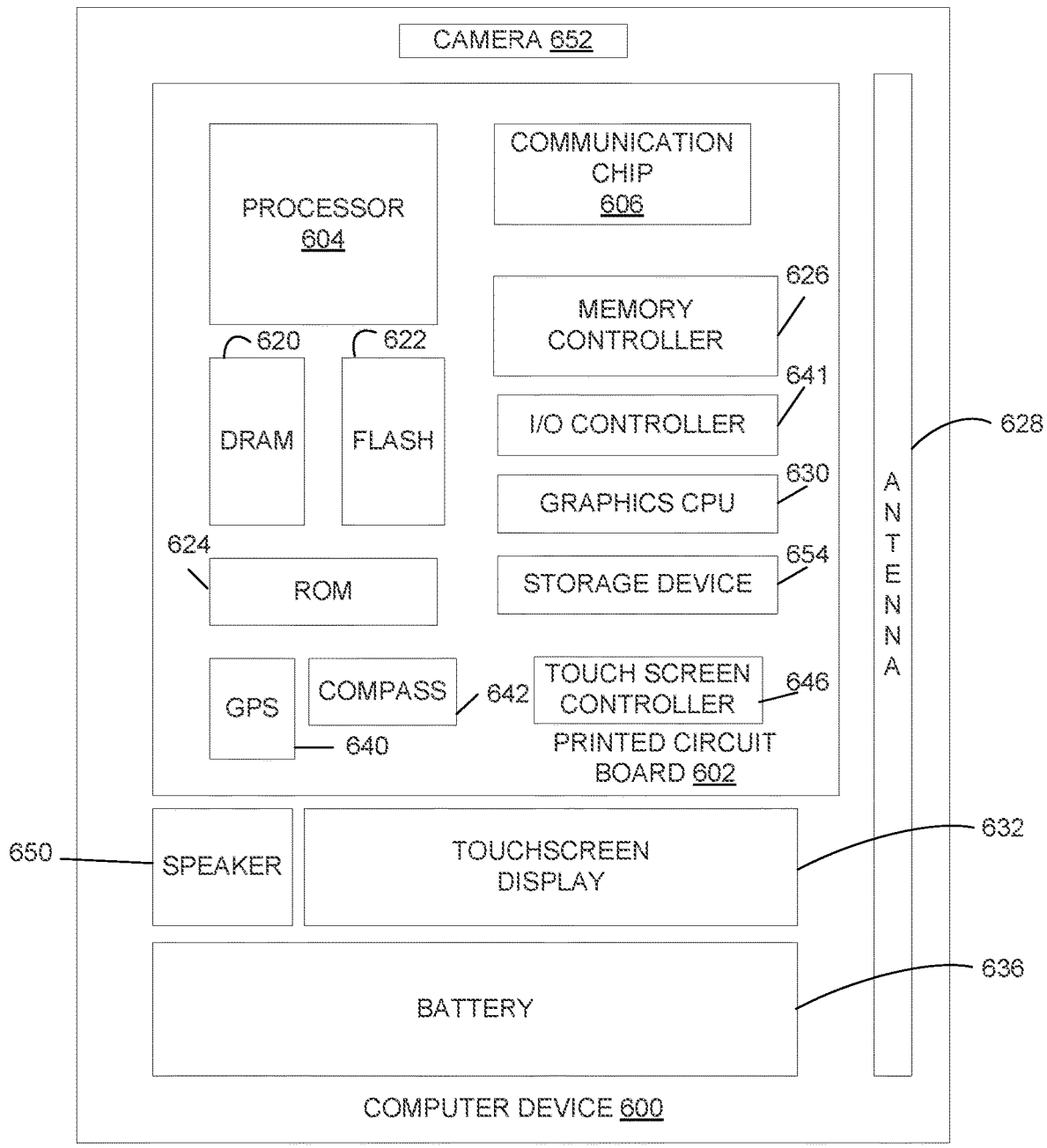
FIG. 6 illustrates an example computer device that may employ the apparatuses and/or methods described herein.

FIG. 6 illustrates an example computer device 600 that may employ the apparatuses and/or methods described herein (e.g., the IC package 100, and/or the computer system 300), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computer device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, one or more components of the computer device 600 may include the IC package 100 and/or the computer system 300.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Example 1 may include an integrated circuit (IC) package, including a first die, a second die, a spacer located between the first die and the second die, the spacer includes glass, and a molding compound that at least partially encompasses the first die, the second die, and the spacer.

Example 2 may include the IC package of example 1 and/or some other example herein, wherein the glass of the spacer is silicate glass.

Example 3 may include the IC package of example 1 and/or some other example herein, wherein the spacer includes a core layer located between a first mask layer and a second mask layer, and wherein the glass is located in the core layer.

Example 4 may include the IC package of example 3 and/or some other example herein, wherein the glass is a glass fiber, and wherein the core layer further includes epoxy resin and silica filler.

Example 5 may include the IC package of example 4 and/or some other example herein, wherein the first mask layer is a solder mask.

Example 6 may include the IC package of example 5 and/or some other example herein, wherein the solder mask includes epoxy resin and a poly-acrylate.

Example 7 may include the IC package of example 6 and/or some other example herein, wherein the solder mask further includes silica filler.

Example 8 may include the IC package of any one of the examples 3-7 and/or some other example herein, wherein the first mask layer and the second mask layer have a same chemical makeup.

Example 9 may include the IC package of any one of the examples 3-7 and/or some other example herein, wherein the core layer has a thickness of between 35 and 45 micrometers.

Example 10 may include the IC package of example 9 and/or some other example herein, wherein the first mask layer and the second mask layer both have a thickness of between approximately 25 and approximately 35 micrometers.

Example 11 may include the IC package of any one of the examples 1-7 and/or some other example herein, wherein the first die is an application-specific IC (ASIC) and the second die is dynamic random-access memory (DRAM), wherein a first operational threshold value of the ASIC is between approximately 100 and approximately 125 degrees-Celsius, and wherein a second operational threshold value of the DRAM is between approximately 70 and approximately 90 degrees-Celsius.

Example 12 may include the IC package of example 11 and/or some other example herein, wherein the IC package is to be mounted, on a side of the IC package, to a printed circuit board, and wherein the ASIC is located between the side of the IC package and the DRAM.

Example 13 may include the IC package of example 12 and/or some other example herein, wherein the IC package further comprises one or more NAND flash memory dies located between the DRAM and a second side of the IC package, the second side of the IC package opposite to the side of the IC package.

Example 14 may include the IC package of example 11 and/or some other example herein, wherein the IC package is a system-in-package.

Example 15 may include a method of producing a spacer for an IC package including positioning a first mask layer on a first side of a core layer, positioning a second mask layer on a second side of the core layer, the second side of core layer opposite to the first side of the core material, and laminating the first mask layer and the second solder mask to the core layer.

Example 16 may include the method of example 15 and/or some other example herein, wherein laminating the first mask layer and the second mask layer to the core layer includes heating the first mask layer and the second mask layer.

Example 17 may include the method of any one of the examples 15 and 16 and/or some other example herein, wherein laminating the first mask layer and the second mask layer to the core layer includes applying pressure to the first mask layer and the second mask layer, the pressure compressing the first mask layer and the second mask layer to the core material.

Example 18 may include the method of any one of the examples 15 and 16 and/or some other example herein, wherein the first mask layer and the second mask layer are film-type solder masks.

Example 19 may include the method of any one of the examples 15 and 16 and/or some other example herein, wherein the core layer includes glass fiber with epoxy resin and silica filler, and wherein the first mask layer and the second mask layer include epoxy resin and poly-acrylate.

Example 20 may include a computer system, including a printed circuit board (PCB), and a system-in-package (SIP) mounted, on a first side of the SIP, to the PCB. The SIP may include dynamic random-access memory (DRAM), an application-specific integrated circuit (ASIC), the ASIC located between the DRAM and the first side of the SIP, and a spacer that includes glass, the spacer located between the DRAM and the ASIC.

Example 21 may include the computer system of example 20 and/or some other example herein, wherein the glass of the spacer is silicate glass.

Example 22 may include the computer system of example 20 and/or some other example herein, wherein the spacer includes a core layer located between a first mask layer and a second mask layer, and wherein the glass is located in the core layer.

Example 23 may include the computer system of example 22 and/or some other example herein, wherein the glass is a glass fiber, and wherein the core layer further includes epoxy resin and silica filler.

Example 24 may include the computer system of example 23 and/or some other example herein, wherein the first mask layer includes epoxy resin and a poly-acrylate.

Example 25 may include the computer system of example 24 and/or some other example herein, wherein the first mask layer further includes silica.

Example 26 may include the computer system of any one of the examples 22-25 and/or some other example herein, wherein the first mask layer and the second mask layer have a same chemical makeup.

Example 27 may include the computer system of any one of the examples 22-25 and/or some other example herein, wherein the core layer has a thickness of between 35 and 45 micrometers.

Example 28 may include the computer system of example 27 and/or some other example herein, wherein the first mask layer and the second mask layer both have a thickness of between approximately 25 and approximately 35 micrometers.

Example 29 may include the computer system of any one of the examples 20-25 and/or some other example herein, wherein the ASIC has an operational threshold value of between approximately 100 and approximately 125 degrees-Celsius, wherein the DRAM has an operational threshold value of between approximately 70 and approximately 90 degrees-Celsius, and wherein the spacer is to reduce heat transfer between the ASIC and the DRAM.

Example 30 may include the computer system of any one of the examples 20-25 and/or some other example herein, wherein the SIP further includes one or more NAND flash memory dies located between the DRAM and a second side of the SIP, the second side of the SIP opposite to the first side of the SIP.

Example 31 may include a method of producing an integrated circuit (IC) package, including forming a molded layer on a distribution layer, positioning a first die on the molded layer, the first die on an opposite side of the molded layer from the distribution layer, positioning a glass spacer on the first die, the glass spacer on an opposite side of the first die from the molded layer, positioning a second die on the glass spacer, the second die on an opposite side of the glass spacer from the first die, and installing one or more wires among one or more of the distribution layer, the first die, and the second die.

Example 32 may include the method of example 31 and/or some other example herein, further including positioning a die group on the second die, the die group on an opposite side of the second die from the glass spacer, wherein installing the one or more wires further includes coupling a portion of the one or more wires to the die group.

Example 33 may include the method of any one of the examples 31 and 32 and/or some other example herein, further including applying a molding compound that at least partially encompasses one or more of the first die, the glass spacer, and the second die.

Example 34 may include the method of any one of the examples 31 and 32 and/or some other example herein, wherein the first die is an application specific integrated circuit die and the second die is a dynamic random access memory die.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A computer system, comprising:
 a printed circuit board (PCB); and
  a system-in-package (SIP) mounted, on a first side of the SIP, to the PCB, wherein the SIP includes:
  dynamic random-access memory (DRAM);
  an application-specific integrated circuit (ASIC), the ASIC located between the DRAM and the first side of the SIP; and
  a spacer located between the DRAM and the ASIC, wherein the spacer includes:
   a first mask layer;
   a second mask layer; and
   a core layer located between the first mask layer and the second mask layer, wherein the core layer includes glass.

2. The computer system of claim 1, wherein the glass of the spacer is silicate glass.

3. The computer system of claim 1, wherein the glass is a glass fiber, and wherein the core layer further includes epoxy resin and silica filler.

4. The computer system of claim 3, wherein the first mask layer includes epoxy resin and a poly-acrylate.

5. The computer system of claim 4, wherein the first mask layer further includes silica.

6. The computer system of claim 1, wherein the core layer has a thickness of between 35 and 45 micrometers.

7. The computer system of claim 1, wherein the first mask layer is a solder mask.

8. The computer system of claim 7, wherein the solder mask includes epoxy resin and a poly-acrylate.

9. The computer system of claim 1, wherein the first mask layer and the second mask layer have a same chemical makeup.

10. The computer system of claim 1, wherein the first mask layer and the second mask layer both have a thickness of between 25 and 35 micrometers.

11. A system-in-package (SIP) comprising:
 dynamic random-access memory (DRAM);
 an application-specific integrated circuit (ASIC), the ASIC located between the DRAM and a first side of the SIP that is mountable to a printed circuit board (PCB); and
 a spacer located between the DRAM and the ASIC, wherein the spacer includes:
  a first mask layer;
  a second mask layer; and
  a core layer located between the first mask layer and the second mask layer,
 wherein the core layer includes glass.

12. The SIP of claim 11, wherein the glass of the spacer is silicate glass.

13. The SIP of claim 12, wherein the glass is a glass fiber, and wherein the core layer further includes epoxy resin and silica filler.

14. The SIP of claim 13, wherein the first mask layer includes epoxy resin and a poly-acrylate.

15. The SIP of claim 14, wherein the first mask layer further includes silica.

16. The SIP of claim 11, wherein the core layer has a thickness of between 35 and 45 micrometers.

17. The SIP of claim 11, wherein the first mask layer is a solder mask.

18. The SIP of claim 17, wherein the solder mask includes epoxy resin and a poly-acrylate.

19. The SIP of claim 11, wherein the first mask layer and the second mask layer have a same chemical makeup.

20. The SIP of claim 19, wherein the first mask layer and the second mask layer both have a thickness of between 25 and 35 micrometers.

* * * * *